United States Patent
Van Deventer

(10) Patent No.: US 8,841,898 B2
(45) Date of Patent: Sep. 23, 2014

(54) METHOD AND APPARATUS FOR DETECTING A LIGHTNING STRIKE

(75) Inventor: Bruce Van Deventer, Lynnwood, WA (US)

(73) Assignee: The Boeing Company, Chicago, IL (US)

( * ) Notice: Subject to any disclaimer, the term of this patent is extended or adjusted under 35 U.S.C. 154(b) by 269 days.

(21) Appl. No.: 13/280,915

(22) Filed: Oct. 25, 2011

(65) Prior Publication Data

US 2013/0099772 A1 Apr. 25, 2013

(51) Int. Cl.
| | | |
|---|---|---|
| *G01R 31/02* | (2006.01) | |
| *G01R 19/165* | (2006.01) | |
| *H02G 13/00* | (2006.01) | |
| *G01R 15/18* | (2006.01) | |
| *G01R 31/00* | (2006.01) | |
| *B64D 45/02* | (2006.01) | |
| *G01R 19/00* | (2006.01) | |
| *G01V 3/08* | (2006.01) | |
| *G01R 29/08* | (2006.01) | |

(52) U.S. Cl.
CPC ........ *G01R 15/183* (2013.01); *G01R 19/16519* (2013.01); *H02G 13/00* (2013.01); *G01R 31/008* (2013.01); *B64D 45/02* (2013.01); *G01R 29/0842* (2013.01)
USPC .......................... 324/72; 324/76.11; 324/344

(58) Field of Classification Search
CPC ........... G01R 15/183; G01R 19/16519; G01R 29/0842; G01R 31/008; G01R 31/1236; G01R 15/18
USPC .................. 324/72, 344, 551, 76.11; 340/945
See application file for complete search history.

(56) References Cited

U.S. PATENT DOCUMENTS

| | | | |
|---|---|---|---|
| 3,889,185 A | | 6/1975 | Wojtasinski et al. |
| 4,749,880 A | * | 6/1988 | Kobatake .................... 327/78 |
| 5,446,431 A | * | 8/1995 | Leach et al. ................. 335/18 |
| 5,497,075 A | | 3/1996 | Bourdet et al. |
| 5,929,625 A | | 7/1999 | Lewiner et al. |
| 6,586,920 B1 | * | 7/2003 | Hirakawa .................... 324/72 |
| 7,245,511 B2 | * | 7/2007 | Lancaster et al. .......... 363/53 |

(Continued)

FOREIGN PATENT DOCUMENTS

| | | |
|---|---|---|
| EP | 0174736 | 3/1986 |
| EP | 0549432 | 6/1993 |

(Continued)

OTHER PUBLICATIONS

EP 0549432 (A1)—Surge arrester with better mechanical properties. Machine Translation.*
FR 2936063; machine tranlation.*
PCT, International Search Report and Written Opinion, International Application No. PCT/US2012/057151 (Jan. 31, 2013).

*Primary Examiner* — Jermele M Hollington
*Assistant Examiner* — Raul Rios Russo
(74) *Attorney, Agent, or Firm* — Robert B. Parker

(57) ABSTRACT

Described herein is a self-powered system for detecting a current spike. The current spike is delivered through a current return network that energizes a resonant circuit to produce an alternating electrical output. The output is rectified by a rectifier into direct output that is then transferred to an integrator circuit. The integrator circuit slowly builds to and dissipates from a voltage threshold corresponding to an output transistor. When the output transistor is triggered by the voltage threshold this trigger is communicated to a fault monitoring software that recognizes the current spike.

18 Claims, 4 Drawing Sheets

(56) References Cited

U.S. PATENT DOCUMENTS

| | | |
|---|---|---|
| 7,417,843 B1 * | 8/2008 | Fowler .......................... 361/230 |
| 7,714,743 B1 | 5/2010 | Woodell et al. |
| 2002/0047601 A1 * | 4/2002 | Shannon et al. ............. 315/224 |
| 2003/0030327 A1 * | 2/2003 | Robinson et al. ............... 307/31 |
| 2010/0127564 A1 | 5/2010 | Braden et al. |
| 2011/0102767 A1 * | 5/2011 | Volanthen et al. ............. 356/32 |
| 2011/0227637 A1 * | 9/2011 | Stuber et al. ................. 327/546 |
| 2012/0154021 A1 * | 6/2012 | Patil et al. ..................... 327/534 |
| 2012/0268015 A1 * | 10/2012 | Sun et al. ...................... 315/136 |

FOREIGN PATENT DOCUMENTS

| | | |
|---|---|---|
| EP | 0762589 | 3/1997 |
| FR | 2624319 | 6/1989 |
| FR | 2936063 | 3/2010 |
| JP | 2003059614 | 2/2003 |

* cited by examiner

METHOD AND APPARATUS FOR DETECTING A LIGHTNING STRIKE

BACKGROUND

The current disclosure relates to a current spike detector and more specifically to an electrical circuit for detecting lightning strikes in aircraft.

Lightning strikes on aircraft are relatively rare events, yet occur with sufficient frequency and are sufficiently damaging to mechanical and electrical systems that lightning strike prevention and mitigation are important components within an aircraft.

Reporting of lightning strikes, their location, intensity, and effects are presently handled by the aircraft and ground crews. The aircraft crew is responsible for determining whether the aircraft has been struck, typically through visual confirmation or short-lived electrical interference of instrumentation or lighting. The ground crew is then tasked to determine the severity, location, and impact of the lightning strike on the flightworthiness of the aircraft. However, because this system is based on an initial determination by the aircraft crew, this system of reporting may result in over or under reporting of strikes.

When lightning strikes an aircraft a large amount of current passes through the aircraft. In a metal skinned aircraft, this current is predominantly carried over the exterior surfaces of the aircraft. However, aircraft using composite construction often incorporate a lightning or current return network of electrical connectors, installed within the aircraft, to carry the large currents which result from lightning strikes. In such composite aircraft, this current may be directed through a current return network that reduces the chance of electrical systems being damaged by the current spike. However, some temporary electrical system failures may still occur. When these systems recover, they issue a warning, typically to the cockpit although they may be recorded elsewhere, that must be checked by a maintenance crew when the aircraft is next grounded.

Some of these electrical system warnings may be so-called "nuisance warnings" that occur due to the system resetting because of the lightning strike rather than any problem with the system. However, these systems will still require manual resetting by a maintenance worker to reset the warnings and determine if the fault was due to the lightning strike event or a problem in the affected system.

Therefore, there is recognized a need in the art for a lightning detection system.

SUMMARY

Described herein is a self-powered system for detecting a lightning strike on aircraft that include a current return network. A resonant circuit is in communication with the current return network and provides an alternating current electrical output. A rectifier receives this output and transforms it into a direct output that is transferred to an integrator circuit. As the integrator circuit is charged, it reaches or crosses a voltage threshold that in turn triggers an output transistor. The actuation of this transistor communicates a signal to a fault monitoring software.

According to further embodiments, the resonant circuit may include a transistor and capacitor while the integrator circuit may include a capacitor that is charged at or above the threshold voltage for several seconds.

Further described is a method for detecting a current spike in a current return network. A ferrite core is in inductive communication with the current return network and an inductor that forms a part of a detection circuit. The detection circuit includes a resonant circuit, an integrator circuit, and a transistor. When a current spike is passed through the current return network a current is provided in the resonant circuit through induction. The resonant circuit creates an alternating current that is rectified and transferred to the integrator circuit. When the integrator circuit builds to a threshold level the transistor's state is changed. This change in state is therefore indicative of the voltage spike.

According to further improvements, the rectifier may be a half-wave rectifier and the resonant circuit may include an inductor and capacitor. Further, the ferrite core may be either permanently or removably coupled to the current return network. According to one embodiment, the transistor is a normally open n-MOSFET that allows a current to pass through when the system is activated. The passage of this current is used to determine the change in state.

Also disclosed is a method for determining whether lightning has struck an aircraft. This method includes the steps of utilizing an existing current return network throughout the aircraft and providing a passive electrical circuit in inductive communication with the current return network. When a lightning strike passes through the current return network, an electrical current is induced in the passive electrical circuit. This current provides a voltage differential to a transistor that is triggered when the voltage differential reaches a threshold level. The state of this transistor is therefore indicative of whether the aircraft has been struck by lightning.

According to further embodiments, the transistor may be normally-open so that current passing through the transistor indicates a lightning strike. Alternatively, the transistor may be normally closed so that a lightning strike is indicated by current no longer passing through the transistor.

The features, functions, and advantages that have been discussed can be achieved independently in various embodiments of the present invention or may be combined in yet other embodiments further details of which can be seen with reference to the following description and drawings

DESCRIPTION

Figure 1:
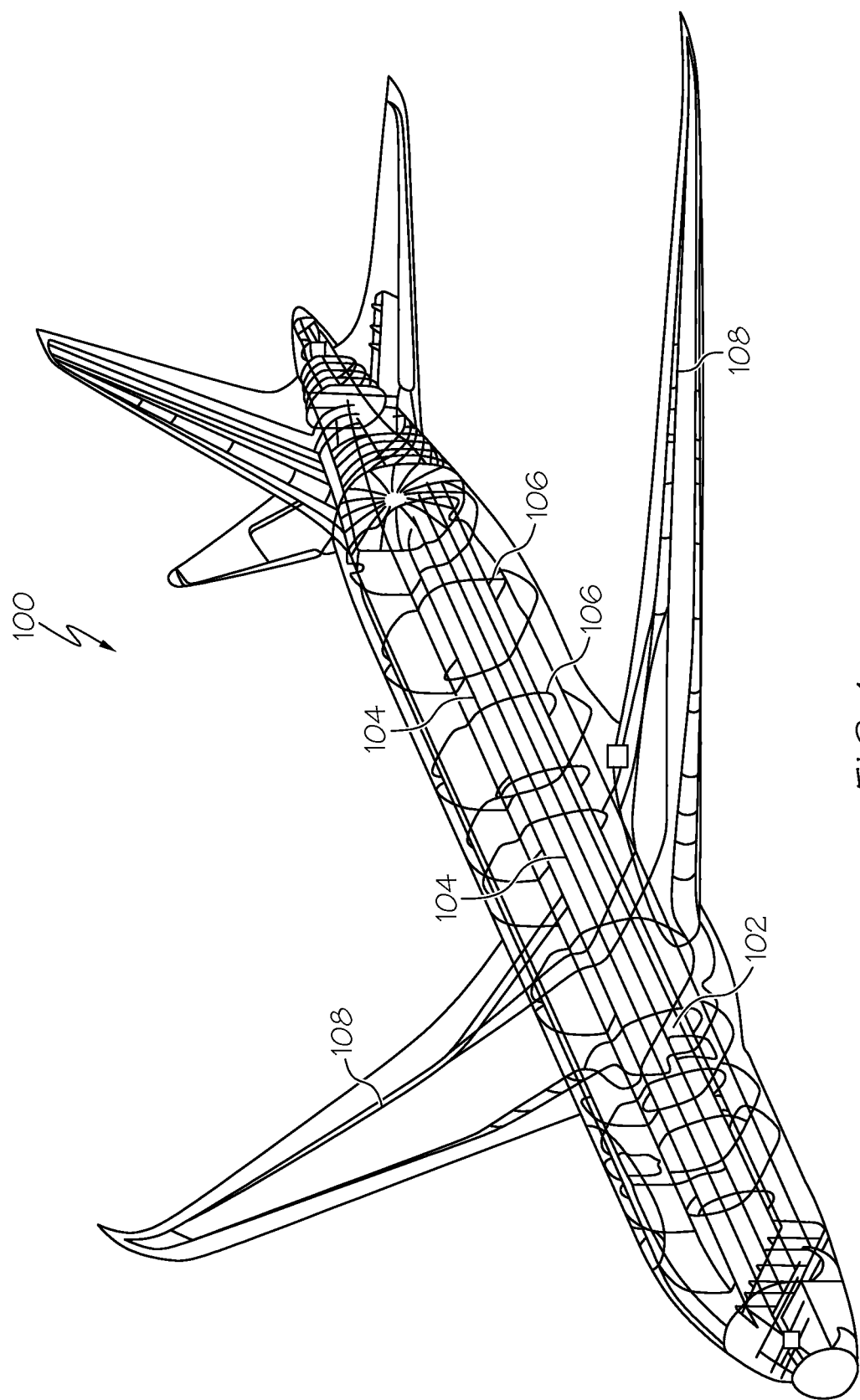
FIG. 1 is a perspective view of an aircraft showing a current return network.

FIG. 1 shows a perspective view of an aircraft 100 cutaway to show a current return network 102 that may include longitudinal 104 and lateral 106 electrically conductive elements extending along a substantial portion of the aircraft 100. The current return network 102 also includes current carrying paths 108 extending through the wings and tail of the aircraft 100. The longitudinal 104 and lateral 106 elements as well as the current carrying paths 108 may be low resistance electrical wires, metal, or other conductive material including but not limited to aircraft structural elements, hydraulic lines, or dedicated current return components. These elements 104, 106, 108 of the current return network 102 may be connected to one another to provide a number of redundant electrical pathways that may be adapted to carry fault current, provide grounding, carry lightning current, provide electromagnetic shielding, minimize resistance and voltage differentials and provide a bleed path for electrostatic charge.

Figure 2:
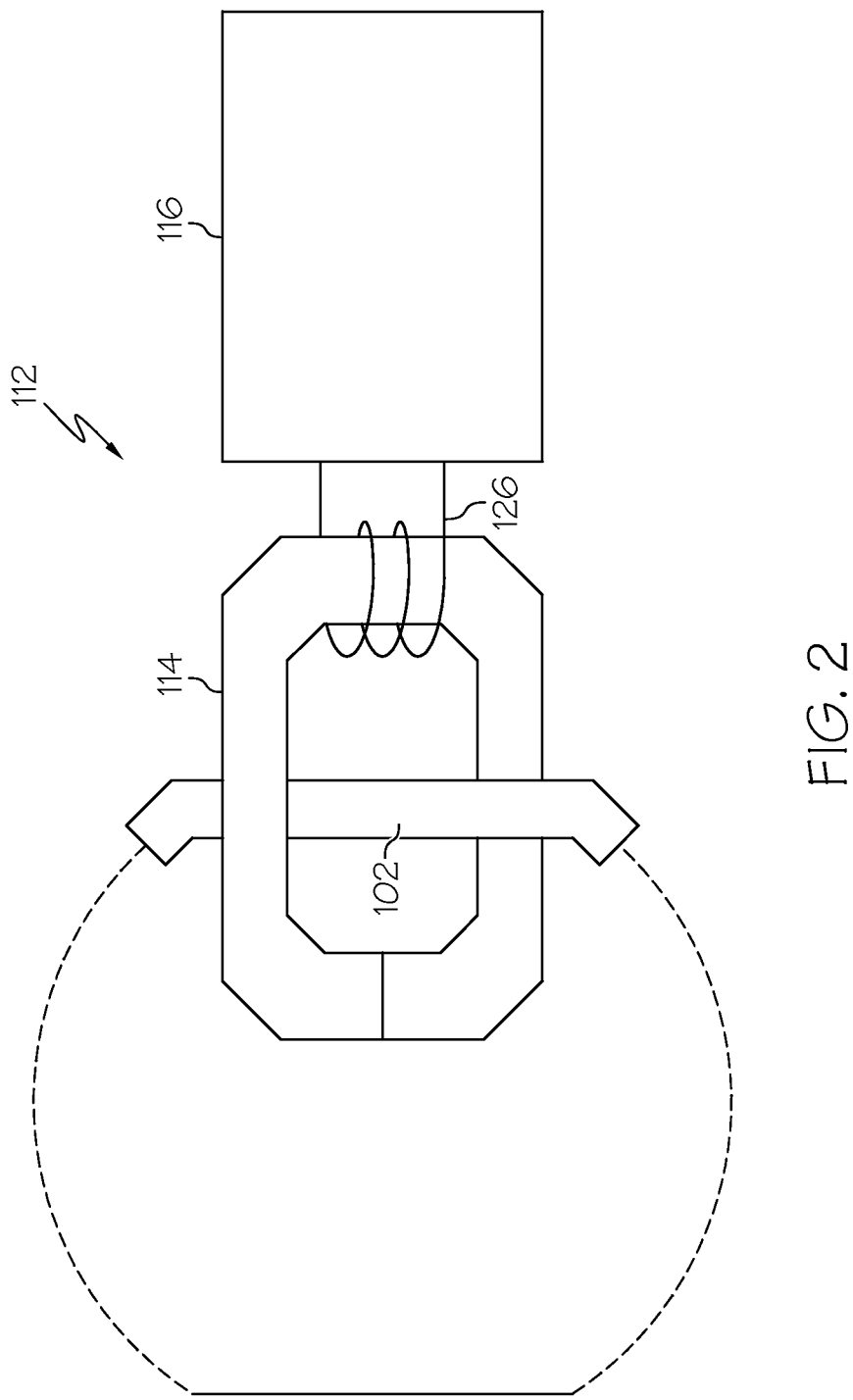
FIG. 2 is a schematic view showing the attachment between the current return network and a detection circuit.

As shown in FIG. 2, a lightning strike detection device 112 may include a clamp-on magnetically permeable core with windings 114 that is secured about a portion of the current return network 102 and a lightning strike detection circuit 116 in communication with the ferrite core 114. The clamp-on ferrite core 114 is a closed loop of high-magnetic permeability material, such as iron, ferrous-oxide coated ceramics, or other material. The ferrite core 114 may be a removable or permanent device attached to the current return network.

Figure 3A:
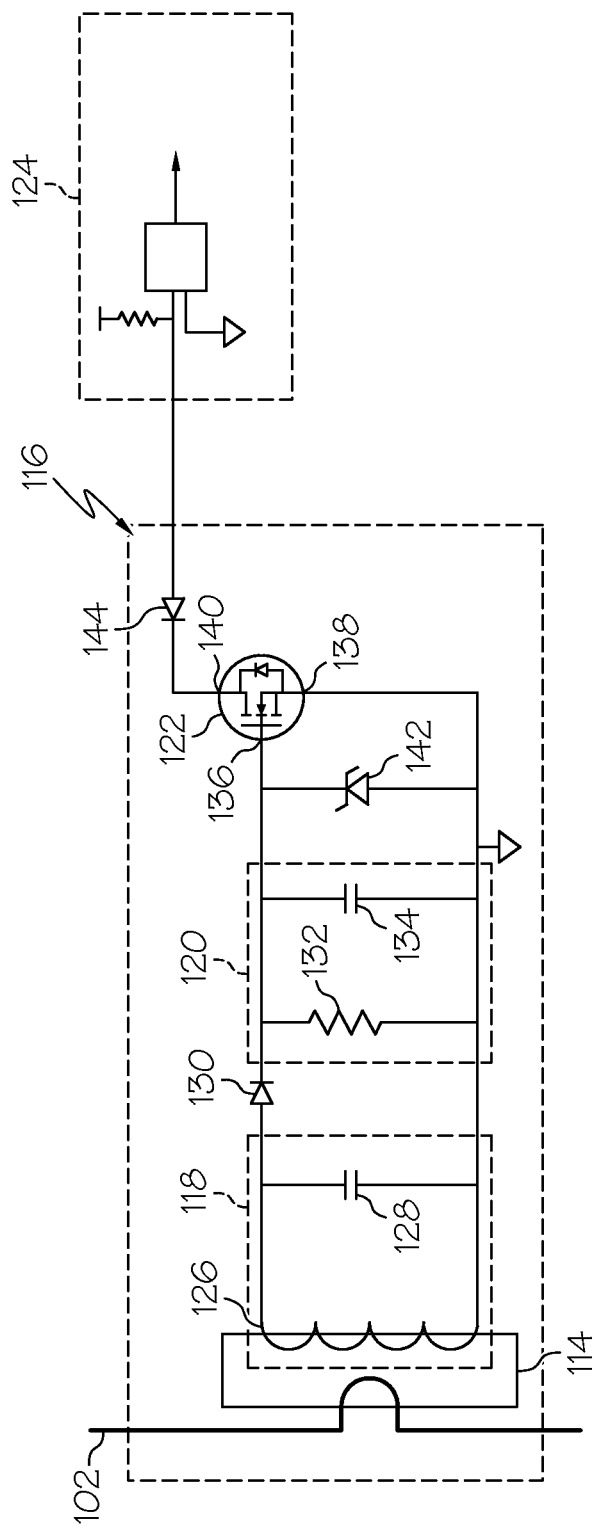
FIG. 3A is a schematic view of the detection circuit.

FIG. 3A illustrates the lightning strike detection circuit 116 in further detail. As shown in this figure, the circuit 116 may include a resonant circuit 118, an integrator circuit 120, and a transistor 122 connected to external monitoring equipment 124. The resonant circuit 118 may include an inductor 126 and first capacitor 128 in parallel that is in parallel with and coupled to the integrator circuit 120 by a rectifying diode 130. The integrator circuit 120 includes a resistor 132 and second capacitor 134 in parallel. The integrator circuit 120 is tied to the gate 136 of the transistor 122 and the transistor source 138 goes to ground. The transistor itself 122 is shown as a normally-open enhancement-mode n-MOSFET that provides a voltage controlled current source between the external monitoring equipment 124 and ground. Electromagnetic interference (EMI) reduction elements are provided in the form of a zener diode 142 and drain diode 144 that reduce the chance of current feedback or voltage spikes that may damage the circuit 116.

According to one embodiment, a number of lightning strike detection devices 112 are positioned about the current return network 102 so as to capture a lightning strike event. With reference to FIG. 2, the devices 112 would preferably be positioned in the Zone 3 areas and may be positioned in Zone 1 or 2 areas such as on or near the engine nacelles or along the aircraft fuselage.

With reference to FIG. 2, the operation of the lightning strike device 112 will be described in further detail. As will be appreciated, when there is no lightning strike event, the lightning detection circuit 116 will remain in an unpowered state. However, when there is a lightning strike event, the circuit will be energized to indicate the event. After the event has been indicated, the circuit will reset to an unpowered state.

When lightning strikes the aircraft, a current spike lasting from 1-50 µs is transferred to the current return network 102. The current return network 102 forms at least one loop around the ferrite core 114 and the inductor 126 forms a number of loops about the ferrite core 114, thus forming a transformer so that when a current pulse passes through the current return network 102, the inductor 126 generates a complementary current.

The inductor 126 and first capacitor 128 that form the resonant circuit 118 will create an alternating current output that energizes the circuit 116. The current output from the resonant circuit 118 is rectified by the rectifying diode 130 to a half-wave output before being transferred to the integrator circuit 120.

The integrator circuit 120 provides a slow charge and discharge for the second capacitor 134, which preferably maintains the voltage difference across the capacitor at a threshold level for several seconds. The integrator circuit provides hold time and automatic resetting for the lightning indication to remain active even if the external monitoring equipment 124 is itself upset by the event.

When the second capacitor 134 is at a threshold level measured by the gate threshold of the transistor 122, the circuit between the source 138 and drain 140 is closed, allowing current to flow through the transistor from the external monitoring equipment 124 to ground. The external monitoring equipment 124 is an external monitoring apparatus that may be installed in the aircraft, and may be a standard aircraft equipment interface, such as an open/ground discrete which senses the electrical open/ground discrete signal made by the circuit 116 and then uses this for fault or maintenance indication logic.

The zener diode 142 ensures that the voltage from the transistor gate to source does not reach a level that might damage the transistor 122 or other components.

The drain diode 144 is positioned between the external monitoring equipment 124 and transistor 122 and allows current to flow from the external monitoring equipment 124 through the transistor. This arrangement ensures that current cannot flow from the transistor 122 to the external monitoring equipment 124 and cause damage in case of a current spike in the ground.

Other improvements to the above-described electrical circuit are also contemplated. According to the embodiment illustrated, the circuit includes an n-MOSFET transistor 122 that is normally open and closes when a positive voltage is applied at the gate 136, allowing current to flow between the source 138 and drain 140. However, it is contemplated that a normally closed depletion mode MOSFET may be substituted for the normally open enhancement mode transistor 122.

The rectifying diode 130 is shown as a single diode in series between the tank circuit and integrator circuit. This half-wave rectifier only passes half of the resonant waveform generated by the resonant circuit 118 and therefore the amount of energy passed is reduced. However, this diode may be replaced with a full wave rectifier, such as a diode bridge, or other type of rectifier if additional energy is required.

The circuit 116 has also been described as including EMI protection elements such as the zener diode 142 and drain diode 144. These elements are included to provide protection against voltage overload of the transistor 122 (zener diode 142) or current feedback to the external monitoring equipment 124. However, these elements are not necessary to operation of the circuit and may be omitted. Alternative protective elements may be included either in lieu of or in addition to these protective elements.

The resonant circuit 118 provides an alternating current based on the lightning strike waveform, but is not necessary to provide a voltage differential to the integrator circuit 120. A current spike in the current return network 102 would produce a corresponding voltage spike in the inductor 126 that could be used to drive the transistor 122. However, the resonant circuit 118 provides the additional advantage of providing a bandlimit function to reduce the sensitivity of the circuit to radio frequency (RF) noise, for example from precipitation static or other RF noise.

As a passive element with a single wire connection (current return network 112), the addition of a built in test for the detection circuit 116 may not be appropriate. The test function may be accomplished by the addition of a second set of windings on the ferrite core 114 that can provide a pulse to the circuit 116 to simulate a lightning strike. This would serve as an effective test to determine that the system is functioning properly.

Figure 3B:
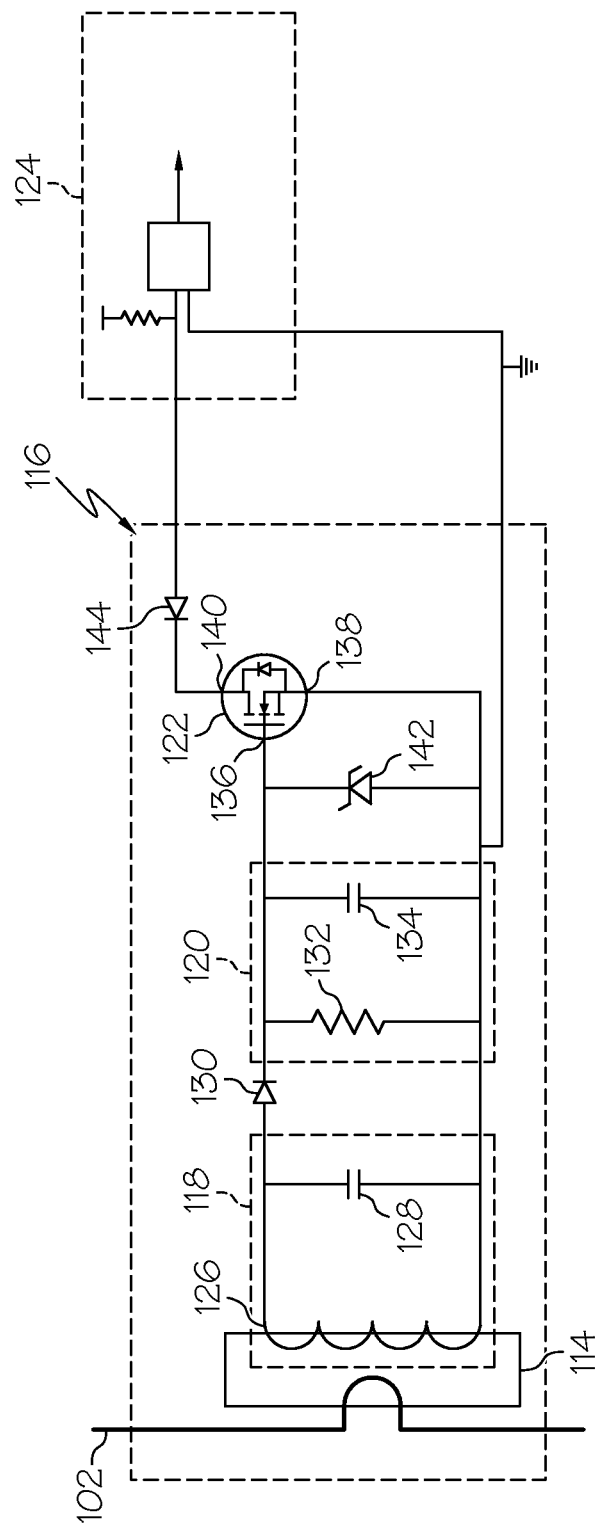
FIG. 3B is a schematic view of an alternative embodiment of the detection circuit.

As described with reference to FIG. 1, the current return network 102 may serve as a ground for the electrical components of the aircraft. However, the surge from a lightning strike through the current return network 102 is often what causes electrical failures in various systems of the aircraft. Therefore, it may be undesirable to use the current return network 102 as a ground for the lightning strike detection circuit 116. According to one embodiment shown in FIG. 3A the external monitoring equipment 124 is connected to a ground, such as the current return network 102, and the lightning strike detection circuit 116 is connected to an independent ground. FIG. 3B shows an alternative arrangement where the lightning strike detection circuit 116 and external monitoring equipment share a common ground 146, which may be an independent ground.

While the method and forms of apparatus disclosed herein constitute preferred aspects of the disclosed lightning detection apparatus and method, other methods and forms of apparatus may be employed without departing from the scope of the invention.

What is claimed is:

1. A self-powered system for detecting a lightning strike comprising:
    a current return network receiving and dissipating said lightning strike;
        a resonant circuit having a transformer and a capacitor, said transformer in communication with said current return network and providing an alternating electrical output based on a waveform of said lightning strike, and said transformer including an inductor that is connected to said capacitor in parallel;
    a rectifier for rectifying said alternating electrical output into a direct electrical output;
    a slow integrator that builds to a voltage threshold when said direct electrical output is received, said slow integrator including an integrating capacitor; and
    an output transistor triggered by said slow integrator for communicating a signal with a fault monitoring software.

2. The system of claim 1 wherein said current return network comprises an electrically conductive path within an aircraft.

3. The system of claim 1 wherein said integrating capacitor is charged for several seconds.

4. A method of detecting a voltage spike in a current return network, said method comprising the steps of:
    providing a ferrite core in inductive communication with said current return network;
    providing a detection circuit having a resonant circuit in inductive communication with said ferrite core, an integrator circuit, and a transistor, said resonant circuit having an inductor and a capacitor that is connected to said inductor in parallel;
    providing a current spike through said current return network;
    inductively energizing said resonant circuit to provide an alternating current based on a waveform of said lightning strike;
    rectifying said current;
    charging an integrating capacitor in said integrator circuit to a threshold voltage level;
    changing said transistor's state when said threshold voltage level is reached; and
    detecting said change in state as indicative of said voltage spike.

5. The method of claim 4 wherein said rectification is by means of a half-wave rectifier.

6. The method of claim 4 wherein said current return network, said inductor, and said ferrite core comprise a transformer.

7. The method of claim 6 wherein said ferrite core is selectively removable from said current return network.

8. The method of claim 7 further comprising the step of attaching said ferrite core to said current return network.

9. The method of claim 4 wherein said transistor is a normally open n-MOSFET.

10. The method of claim 9 further including the step of providing a remote fault monitor.

11. The method of claim 10 wherein current flow from said remote fault monitor through said transistor is used to detect said change in state.

12. The method of claim 11 further comprising a resistor, wherein a voltage drop across said resistor is created once said change in state is detected.

13. A method for determining whether a lightning strike has occurred on an aircraft, the method comprising the steps of:
    providing a current return network throughout said aircraft;
    providing a passive electrical circuit in inductive communication with said current return network by means of a magnetically permeable core, said passive electrical circuit including a voltage controlled transistor and a resonant circuit, wherein said resonant circuit provides an alternating current based on a waveform of said lightning strike, and wherein said resonant circuit includes an inductor and a capacitor that is connected to said inductor in parallel;
    directing a current spike from a lightning strike through said current return network;
    transforming said current spike through said current return network into a current source in said electrical circuit;
    charging an integrating capacitor in an integrator circuit to a threshold voltage level;
    providing said threshold voltage level across said transistor to change said transistor from a normal state to an activated state based on said integrating capacitor being at said threshold voltage level; and
    determining said lightning strike by measuring said change.

14. The method of claim 13 wherein said transistor changes from a normally open state to a closed state when said threshold voltage level is reached.

15. The method of claim 14 wherein said change is measured by a current draw through said transistor.

16. The method of claim 13 wherein said transistor changes from a normally closed state to an open state when said threshold voltage level is reached.

17. The method of claim 16 wherein said change is measured by current ceasing to flow through said transistor.

18. A self-powered system for detecting a lightning strike comprising:
    a current return network receiving and dissipating said lightning strike;
    a resonant circuit having a transformer and a first capacitor, wherein said transformer is in communication with said current return network and provides an alternating electrical output, and wherein said first capacitor is in parallel with said transformer;
    a rectifier for rectifying said alternating electrical output into a direct electrical output said rectifier comprising a diode that is connected in series to said resonant circuit;
    a slow integrator that builds to a voltage threshold when said direct electrical output is received, wherein said slow integrator includes a second capacitor; and
    an output transistor having a gate, said output transistor triggered by said slow integrator for communicating a signal with a fault monitoring software, said gate of said output transistor connected to said slow integrator.

* * * * *